United States Patent [19]

Golinski et al.

[11] 4,447,948

[45] May 15, 1984

[54] TECHNIQUE FOR INSERTING KEYING MEMBERS INTO BACKPLANES

[75] Inventors: Stanley Golinski, Proviso Township, Cook County, Ill.; Willard E. Rapp, Franklin Township, Somerset County, N.J.

[73] Assignee: AT & T Technologies, Inc., New York, N.Y.

[21] Appl. No.: 364,567

[22] Filed: Apr. 1, 1982

[51] Int. Cl.³ .................................... H05K 3/00

[52] U.S. Cl. .................................... 29/829; 29/739; 29/741; 29/747; 227/111; 227/119

[58] Field of Search ................. 29/829, 747, 739, 741, 29/759, 760, 281.1, 281.3, 281.4, 830; 227/119, 111, 107, 143, 147; 339/17 M, 17 LC, 184 R, 186 R, 184 M, 186 M, 221 M; 361/399

[56] References Cited

U.S. PATENT DOCUMENTS

| | | | |
|---|---|---|---|
| 2,085,894 | 7/1937 | Britton | 227/143 X |
| 2,831,239 | 4/1958 | Pilas et al. | 29/707 X |
| 3,200,361 | 8/1965 | Schwartz et al. . | |
| 3,303,394 | 2/1967 | Peter et al. . | |
| 3,404,362 | 10/1968 | Amendola . | |
| 3,664,016 | 5/1972 | Sevc et al. | 29/760 X |
| 3,675,185 | 7/1972 | Ruehlemann | 339/186 MX |
| 3,680,193 | 8/1972 | Scaminaci, Jr. et al. | 29/760 X |
| 3,729,657 | 4/1973 | Callan et al. . | |
| 3,765,075 | 10/1973 | Olney, Jr. et al. | 29/739 X |
| 3,768,134 | 10/1973 | Reda et al. | 29/739 X |
| 3,812,569 | 5/1974 | Kufner et al. | 29/739 X |
| 3,963,301 | 6/1976 | Stark | 339/186 M |
| 4,058,881 | 11/1977 | Gavin et al. | 29/739 X |
| 4,203,698 | 5/1980 | Dupuis | 29/739 X |
| 4,340,092 | 7/1982 | Chisholm | 140/147 |
| 4,375,719 | 3/1983 | Kent | 29/760 |
| 4,398,779 | 8/1983 | Ling | 339/17 LC |

FOREIGN PATENT DOCUMENTS

| | | | |
|---|---|---|---|
| 2310610 | 9/1974 | Fed. Rep. of Germany | 361/399 |

OTHER PUBLICATIONS

"The BELLPAC* Modular Electronic Packaging System". The Bell System Technical Journal vol. 58, No. 10, Dec. 1979, pp. 2271–2288.

*Primary Examiner*—Howard N. Goldberg
*Assistant Examiner*—Carl J. Arbes
*Attorney, Agent, or Firm*—D. J. Kirk

[57] ABSTRACT

Keying members (42—42), used to permit mating connectors (32—32) to be inserted onto the proper locations on a backplane (22) of a PCB mounting shelf (10), are initially inserted in a transfer member (62). The transfer member (62) is then positioned proximate the backplane (22) and the keying members (42—42) are urged therefrom onto the backplane (22) by an ejection apparatus (60).

7 Claims, 10 Drawing Figures

TECHNIQUE FOR INSERTING KEYING MEMBERS INTO BACKPLANES

TECHNICAL FIELD

The instant invention is directed to inserting coded keying members into backplanes of printed circuit board mounting shelves.

BACKGROUND OF THE INVENTION

Printed circuit board (PCB) plug-in mounting shelves are well known. Such shelves are basically comprised of an enclosure into which one or more PCB's can be slidably inserted or removed for repair and a backplane having a multitude of pins therethrough which forms the backwall of the shelf. A connector affixed to one end of the PCB engages pins on the backplane once fully inserted into the enclosure. The pins are also electrically connected to other pins in the same shelf, other shelves and/or equipment remote from the shelves.

Each mounting shelf can accept a plurality of PCB's (e.g., up to 40) and the circuitry on each PCB may perform a different function than the others. Therefore, it is necessary to provide a physical coding scheme that will prevent the wrong PCB from being connected to the backplane. One such coding technique is to insert a keying member, comprised of a planar base member with plurality of pins or keys extending therefrom, onto the backplane within the array of pins into which the particular PCB is to be inserted. A portion of the connector on that PCB will have mating openings to receive only the properly coded arrangement of keys in the keying member on the backplane.

Such a coding technique has proved to be most effective in precluding the connection of improper PCB's into the backplane. Heretofore, the insertion of such keying members into the backplane has been done manually. Such manual operation requires that an operator reach inside the shelf, find the proper location, align holes in the substrate to the backplane pins and urge the keying members into place. Such an operation is time consuming, inefficient and can result in the insertion of keying members in the wrong position.

Accordingly, there is a need for a technique for accurately locating and inserting keying members into a backplane of a PCB mounting shelf.

SUMMARY OF THE INVENTION

The instant invention overcomes the foregoing problem of inserting keying members, each comprised of a planar base with a plurality of keys projecting therefrom, onto a backplane having a multitude of connector pins therethrough. This is accomplished by inserting the keys of the keying members into openings in a transfer member; positioning the transfer member proximate the backplane; and sequentially urging the keying members from the transfer member onto the pins in the backplane.

DETAILED DESCRIPTION

Figure 1:
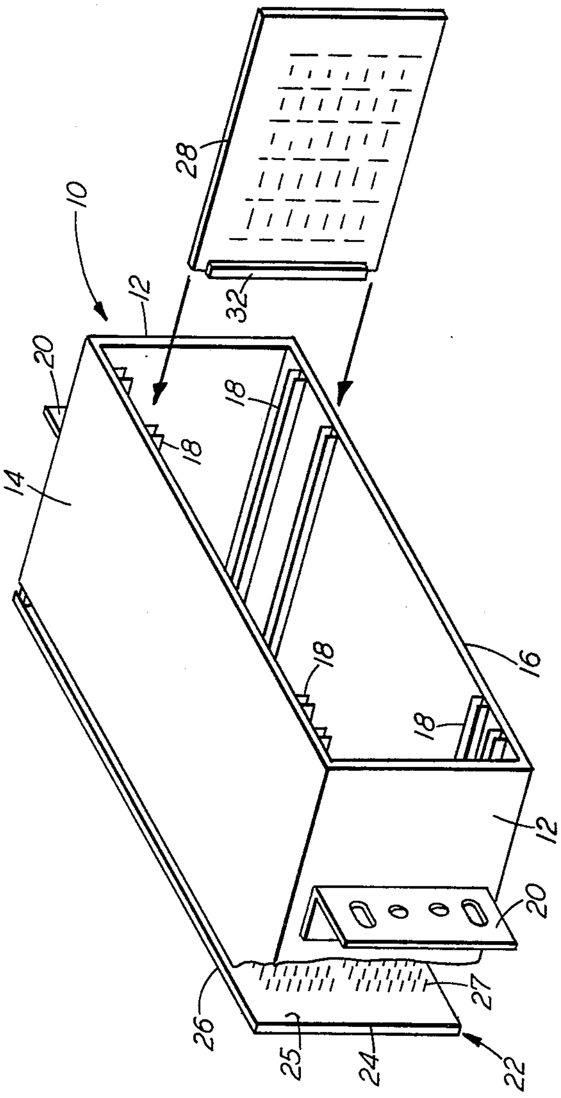
FIG.-1 (PRIOR ART)
FIG. 1 is an isometric view of a PCB shelf.

FIG. 1 is an isometric view of a PCB mounting shelf, generally referred to by the numeral 10, comprised of sidewalls 12—12 with top and bottom portions 14 and 16, respectively. A plurality of parallel channel members 18—18 are fixedly mounted on the inside surface of both the top portion 14 and the bottom portion 16. A pair of mounting brackets 20 are fastened on the outside surface of the sidewalls 12—12. A backplane 22 comprised of a planar base member 24 having front and back sides 25 and 26 respectively with a multitude of metallic connector pins 27—27 passing therethrough is fixedly attached to and spaced from the shelf 10 forming an end wall thereof. A PCB 28 having a connector 32 on one end thereof is shown positioned in alignment with two parallel channel members 18—18 prior to insertion into said members. The PCB 28 may be urged along the channel members 18—18 until the connector 32 is in mating contact with an array of pins 27—27 projecting from the front side 25 of the backplane 22. The backside 26 of the backplane 22 has wired connections (not shown) to other pins, to other shelves 10 and/or remote circuitry (not shown). A plurality of mounting shelves 10 may be placed in equipment bays as is well known in the art.

As hereinbefore indicated, some and possibly all of the PCB's 28—28 may have different circuitry thereon to perform a specifically different function. Thus, it is necessary to provide some form of physical coding means to permit only the proper PCB 28 to be connected to the pins 27—27 in the backplane 22. Various techniques for physically coding the PCB's 28—28 are described in U.S. Pat. Nos. 3,729,657 and 3,404,362.

Figure 2:
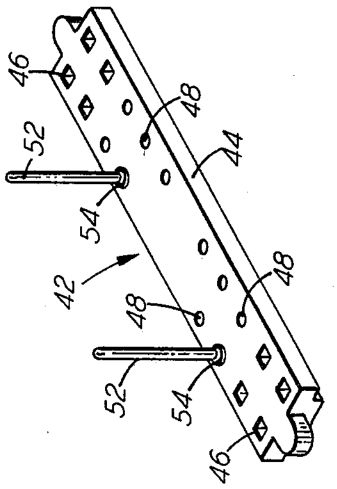
FIG.-2 (PRIOR ART)
FIG. 2 is an isometric view of a keying member.

One particular coding technique makes use of a keying member 42, shown in FIG. 2, which is comprised of a base member 44 with a plurality of square and round openings 46—46 and 48—48, respectively, therethrough. Each of the round openings 48—48 is adapted to receive an elongated cylindrical key 52 which is urged into an opening up to a shoulder 54 thereon. The end of the key 52 passing through the base member 44 is then swaged to fasten the key to the base member 44. Ten round openings 48—48 are shown in FIG. 2 with two keys 52—52 therein. However, various numbers of keys 52—52 may be placed in the openings 48—48 depending on the function of the associated PCB 28. The square openings 46—46 will receive pins 27—27 from the backplane 22.

Figure 3:
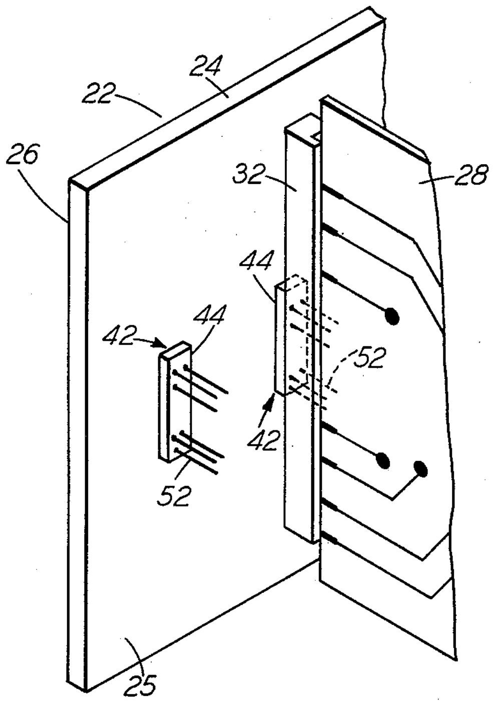
FIG. 3 is a schematic drawing describing the use of the keying member of FIG. 2.
Figure 4:
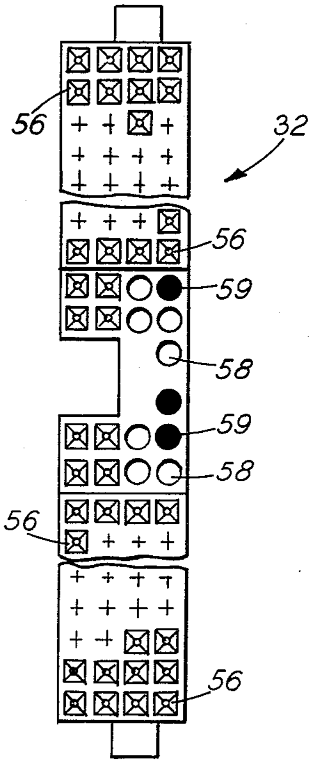
FIG. 4 is an end view of a connector.

FIG. 3 is a schematic drawing depicting the implementation of the above coding technique wherein a plurality of keying members 42—42 are pressed onto pins 27—27 in the backplane 22. FIG. 4 is a front view of the connector 32 having a multitude of slots 56—56 to receive the pins 27—27 projecting from the backplane 22 and make electrical contact therewith. A plurality of keyholes 58—58, located in the central portion of the connector 32, are arranged in a mirror image of the round openings 48—48 in base member 44 of the keying member 42. Selected ones of the keyholes 58—58 are filled with plastic or other material 59 which will prevent the insertion of keys 52—52 therein. Thus, different ones of the keyholes 58—58 will be filled in accordance with the particular function of the associated PCB 28. That PCB 28 can be connected to the pins 27—27 of the backplane 22 only if a keying member 42 has a mating coded array of keys 52—52 (see FIG. 3). Accordingly, such a technique precludes insertion of the wrong PCB 28 therein.

As hereinbefore indicated the keying members 42—42 have been inserted onto the backplane 22 by manually positioning the base member 44 proximate the pins 27—27 of the backplane and urging the keying member towards the backplane to insert a plurality of pins 27—27 into the square openings 46—46 in the base member 44. Such a manual technique is cumbersome and time consuming in that one must reach inside the shelf to urge the keying member 42 onto the appropriate pins 27—27. Additionally, the opportunity for error in placement of the keying member 42 is high due to the multitude of pins 27—27 in the backplane 22 and the limited viewability for the operator placing the keying members therein.

Figure 5:
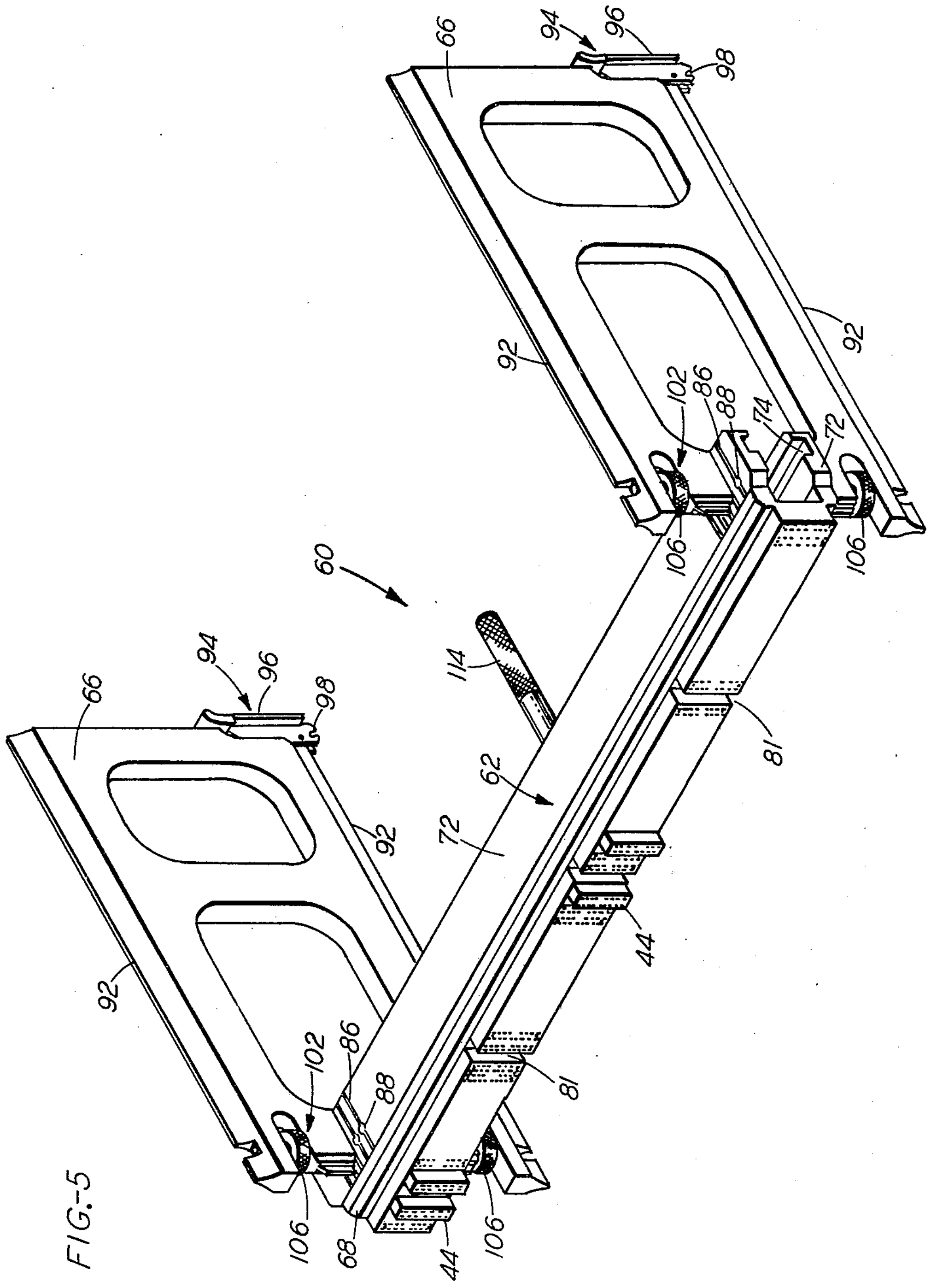
FIG. 5 is an isometric view of the instant keying member insertion apparatus.

FIG. 5 is an isometric view of an apparatus 60 for placing keying members 42—42 onto a backplane 22. The apparatus 60 is comprised of an elongated transfer member 62, an ejection mechanism 64 (see FIG. 6), and a pair of guide arms 66—66.

Figure 5A:
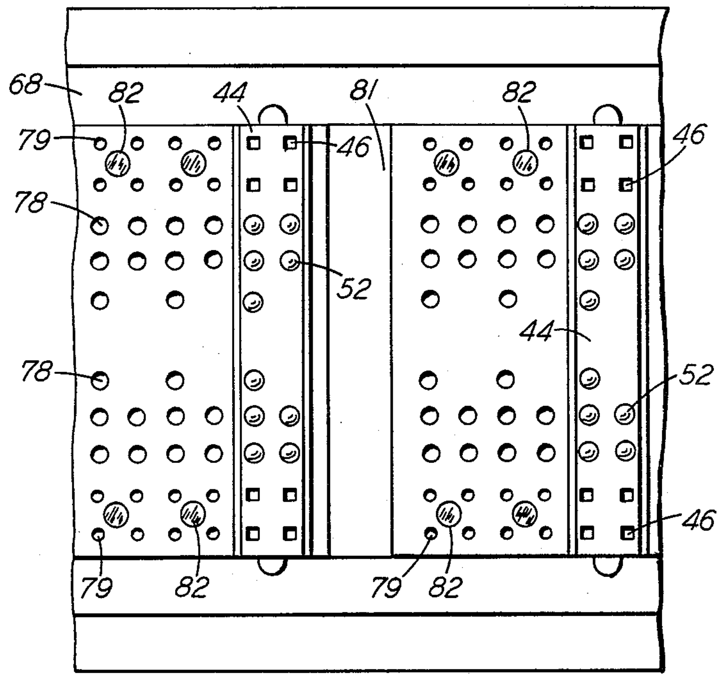
FIG. 5A is a partial front view of the transfer member of the keying member insertion apparatus.
Figure 6:
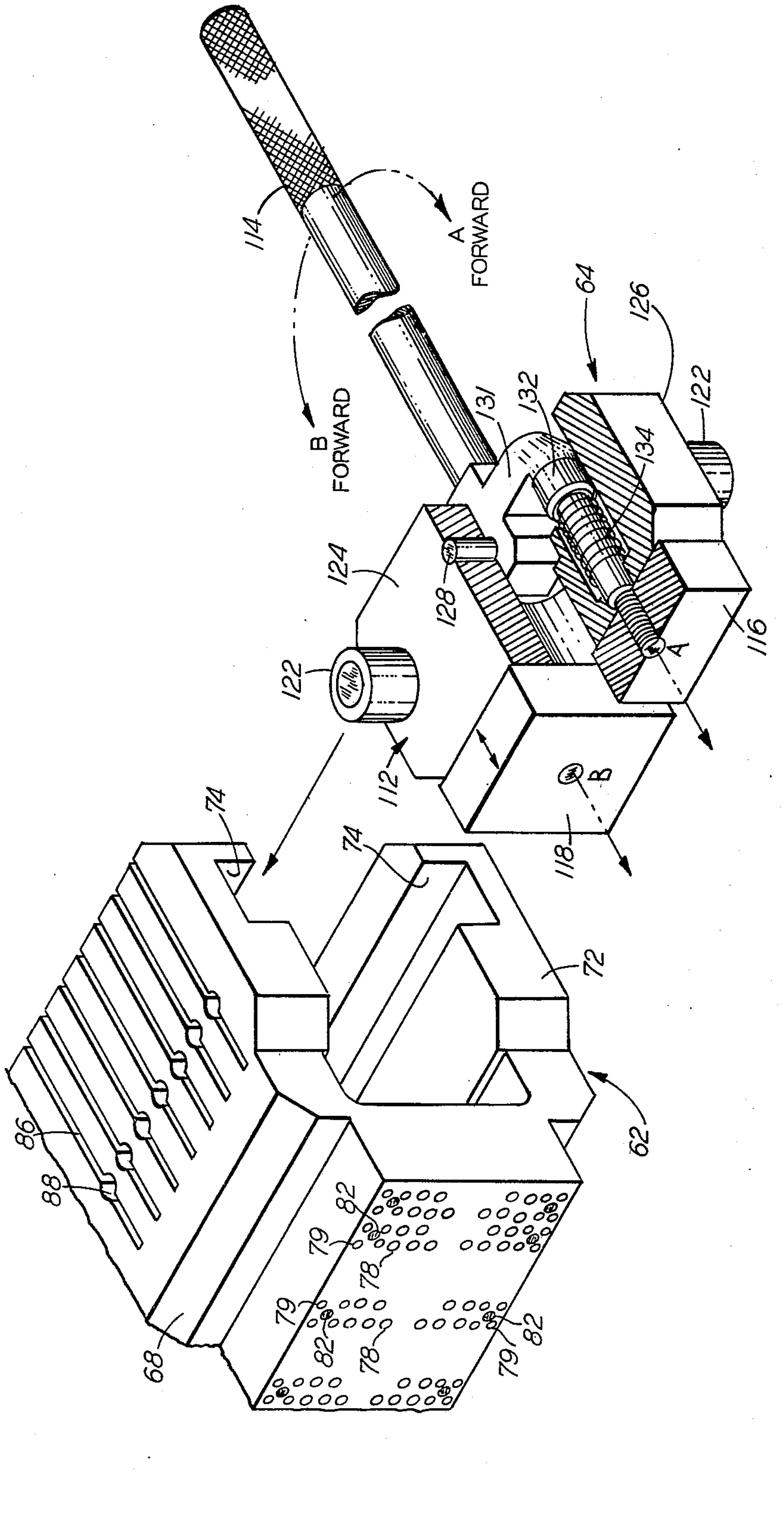
FIG. 6 is a partial isometric view of an insertion and transfer apparatus used to implement the instant invention.
Figure 8:
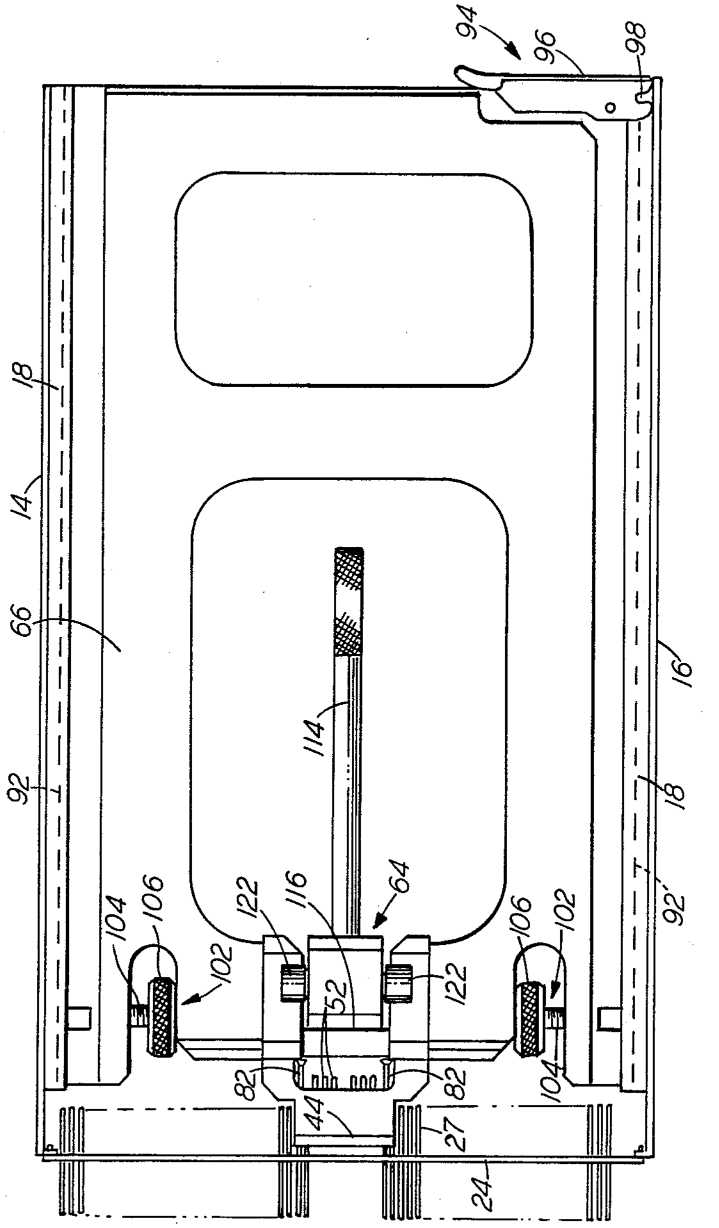
FIG. 8 is a partial cross-sectional view of the insertion apparatus positioned in the PCB mounting shelf.
Figure 9:
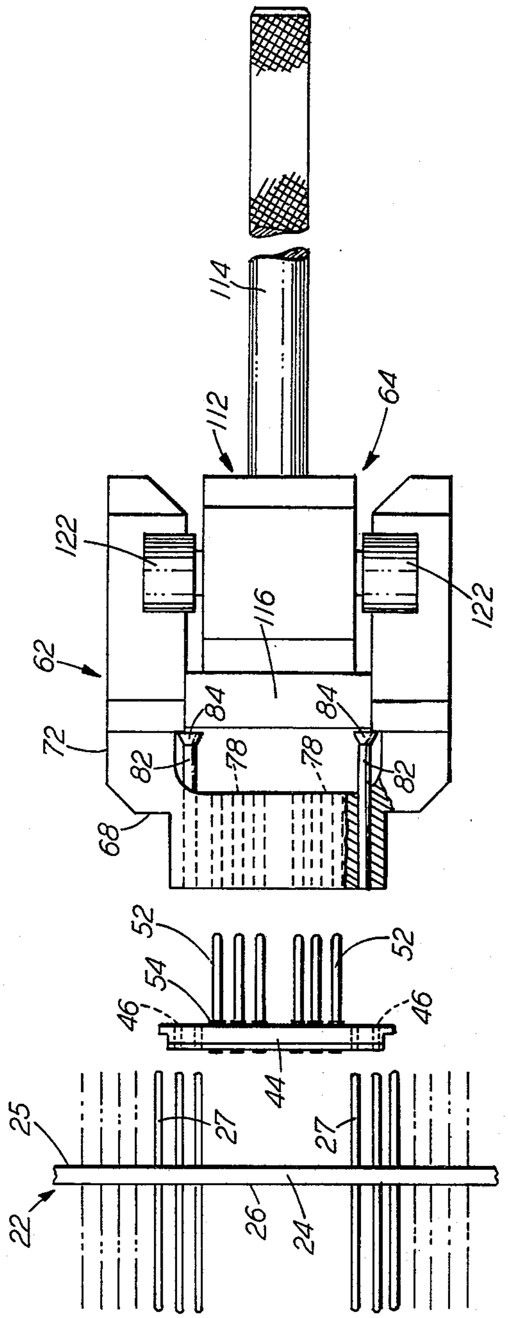
FIG. 9 is an exploded side view depicting the relation of various elements during the instant insertion operation.

The transfer member 62 has a substantially "C" shaped cross-section with a base member 68 having a pair of spaced, parallel legs 72—72 each having an internal channel 74 therein as can best be seen in FIGS. 6 and 8. The base member 68 has two parallel rows of ejection holes 76—76 (see FIG. 5A) and a plurality of rows of holes 78—78 drilled therethrough for receiving the keys 52—52 of the keying members 42—42. Four additional rows of holes 79—79 receive pins 27—27 from the backplane 22 during the transfer operation. A plurality of vertical grooves 79—79 are positioned so as to accommodate reinforcing members (not shown) which may be placed on the backplane 24. An ejector pin 82 (see FIGS. 8 and 9) with a frusto-conical head 84 is positioned for slidable movement in each of the holes 76—76. Additionally, the legs 72—72 have a plurality of parallel slots 86—86 with a hole 88 therein.

Each guide arm 66 (see FIGS. 5 and 8) has upper and lower rails 92—92 and a locking means 94 at one end thereof. The locking means 94 has a pivotable lever arm 96 with a notched end 98. The opposite end of each arm 66 has a pair of engaging means 102—102 comprised of a threaded locking pin 104 having a knob 106 fixedly attached thereto. By rotating the knob 106 the locking pin 104 may be moved towards or away from the hole 88 in the transfer member 62.

The ejection member 64 (see FIGS. 6 and 8) is comprised of a housing 112 with a handle 114 extending therefrom and first and second movable pressure pads 116 and 118, respectively. Cylindrical bearings 122—122 are mounted in aligned, spaced relation on the top and bottom 124 and 126, respectively, of the housing 112. The handle 114 is rotatable about a fixedly mounted pivot pin 128. A pair of opposed arms 131—131 (only one shown) extend from the base of the handle 114. First and second slidable rods 132—132 (only one shown) each have first ends proximate one of the arms 131 with second ends projecting from the housing 112 and threadably connected to the pads 116 and 118. The arms 132—132 are biased by springs 134—134.

In operation a plurality of keying members 42—42 (FIG. 2) is inserted into the appropriate intermediate holes 78—78 of the transfer member 62 as shown in FIG. 5A. This may be accomplished with the guide arms 66—66 in place as shown in FIG. 5 or the knobs 106—106 may be rotated to move the pins 104—104 from the holes 88—88 and the transfer member removed from the guide arms. The keying members 42—42, with the keys 52—52 previously placed therein, may then be inserted manually into the transfer member 62. However, it is contemplated that the members 42—42 could also be inserted by an automatic machine under computer control.

Alternatively, the keys 52—52 may be inserted into the appropriate holes 78—78, under manual or computer control, up to the shoulders 54—54. The base members 44—44 are then positioned on ends of the keys 52—52 which will extend therethrough. The projecting ends are then swaged to fixedly connect the keys 52—52 to the base members 44—44.

Once the keying members 42—42 have been fully inserted the ejection member 64 (see FIG. 6) is slidably positioned between the opposed legs 72—72 of the transfer member 62 by positioning the bearings 122—122 in the opposed channels 72—72. If the transfer member 62 had been removed from the guide arms 66—66 they are then repositioned as shown in FIG. 5 and urged into the shelf 10 along opposed channel members 18—18 as shown in FIG. 4 and the lever arms 96—96 actuated to lock the apparatus 60 in place (see FIG. 8).

Figure 7:
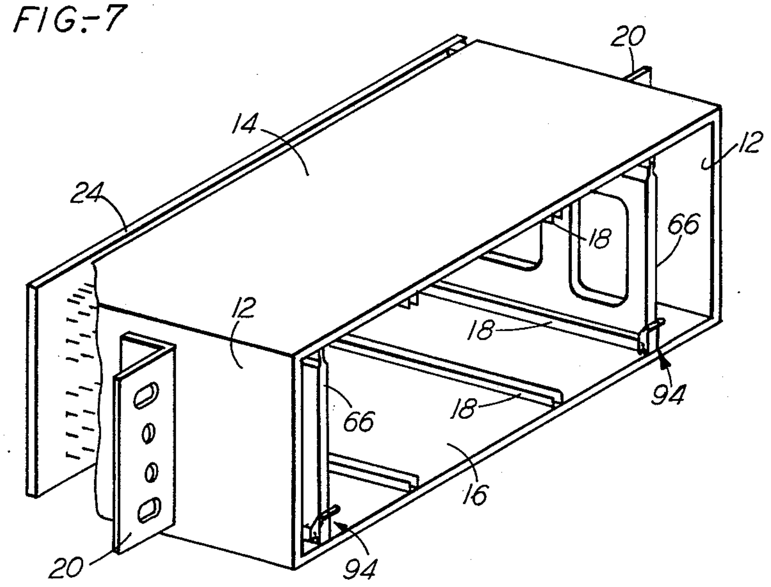
FIG. 7 is an isometric view of insertion apparatus positioned in a PCB mounting shelf.

As can best be seen in FIGS. 7 and 8, once the apparatus 60 is in place, a plurality of the connector pins 27—27 pass through the square openings 46—46 in the base member 44 of the keying member 42. The pins 27—27 also enter into the openings 79—79 in the base member 68 of the transfer member 62 while the keys 52—52 pass into and through the holes 78—78 of the base member 68. It should be noted that the base 44 of the keying member 42 is in spaced, parallel, relation to the planar base member 24 of the backplane 22 as shown in FIG. 8.

An operator then grasps the handle 114 (FIGS. 6 and 7) and moves the ejection member 64 along the channels 74 to one end of the transfer member 62. The handle 114 is then moved to the left causing the pressure pad 116 to move forward into contact with the heads 84—84 of several ejector pins 82—82 (also see FIG. 9) which contact one or more base members 44—44. Continued movement of the plate 116 causes the pins 82—82 to urge the base members 44—44 away from the transfer member 62 and into contact with the planar base member 24 of the backplane 22 with pins 27—27 projecting through the square holes 46—46. The arm 114 of the ejection member 64 is then moved to the right to cause the pressure pad 118 to move the ejector pins 82—82 forward to urge additional base members 44—44 into contact with the planar base member 24 of the backplane 22. The arm 114 is then brought to the straight-out or neutral position and the ejection member 64 indexed to the next groups of keying members 42 to be transferred from the transfer member 62 to the backplane 22.

Such indexing and transferring steps are continued until all the keying members 64—64 have been inserted in the backplane 22. The locking means 94 is then unlocked and the apparatus 60 removed from the shelf 10. All ejector pins 82—82 protruding from the transfer member 62 may then be pushed back, flush with the surface of the transfer member, and the foregoing steps repeated for another mounting shelf 10.

Advantageously, by urging groups containing small numbers (e.g., 1 to 8) of keying members 42—42 into the backplane 22 a smaller force is required which substantially decreases the possibility of deforming or breaking the backplane, particularly where the backplane may be two feet or more in width. However, when the backplane 22 is relatively small area it might occur to one skilled in the art to provide an ejection mechanism that would simultaneously transfer all of the keying members 42 in the transfer member 42 onto the backplane 22.

It is to be understood that the embodiments described herein are merely illustrative of the principles of the invention. Various modifications may be made thereto by persons skilled in the art which will embody the principles of the invention and will fall within the spirit and scope thereof.

What is claimed is:

1. A method of inserting a plurality of keying members, each member comprising a planar base with a plurality of keys projecting therefrom and a plurality of first openings, onto a backplane having a multitude of connector pins therethrough, the method comprising the steps of:

inserting the keys of the keying members into second openings in a transfer member;

positioning the transfer member proximate the backplane; and sequentially urging keying members from the transfer member onto pins in the backplane whereby said pins are inserted at least in some of said first openings.

2. The method as set forth in claim 1, wherein the keying member insertion step is characterized by:

inserting individual keys into a predetermined pattern of openings in the transfer member;

urging the planar base onto the keys which extend therethrough; and swaging the ends of the keys to fasten said keys to the planar base.

3. Apparatus for inserting a plurality of keying members, each member comprised of a planar base with a plurality of keys projecting therefrom, into a backplane having a multitude of connector pins therethrough, said backplane forming the back wall of a PCB mounting shelf, said shelf having a plurality of parallel tracks therein which are normal to the backplane, the apparatus comprising:

a transfer means adapted to receive the keys of each of the keying members;

means for positioning the transfer means within the mounting shelf, proximate the backplane; and means, slidably mounted on the transfer means, for sequentially ejecting groups of keying members from the transfer member onto pins in the backplane.

4. Apparatus for inserting a plurality of keying members, each member comprised of a planar base with a plurality of keys projecting therefrom, into a backplane having a multitude of connector pins therethrough, said backplane forming the back wall of a PCB mounting shelf, said shelf having a plurality of parallel tracks therein which are normal to the backplane, the apparatus comprising:

a transfer means comprising an elongated body having a base with first and second, spaced, parallel legs extending therefrom; the base having a plurality of apertures therein to receive said keys of said keying members; and first and second aligned and parallel channels on the opposed inside surfaces of the first and second parallel legs adapted to slidably receive said sequential ejecting means;

means for positioning the transfer means within the mounting shelf, proximate the backplane; and means, slidably mounted on the transfer means, for sequentially ejecting groups of keying members from the transfer member onto pins in the backplane.

5. The apparatus as set forth in claim 4, wherein the positioning means is comprised of:

first and second substantially planar handles;

locking means located at an end portion of each handle adapted to capture the transfer means therein; and each of said handles having elongated, narrow, rails on the top and bottom portion thereof to permit sliding movement along an opposed pair of the parallel tracks to position said transfer means within said mounting shelf, proximate said backplane.

6. The apparatus as set forth in claim 4, wherein said sequential ejecting means is comprised of:

a housing having a plurality of rotatable bearings affixed to the outside surface thereof for slidable engagement along said parallel channels;

a plurality of rods having first ends slidably mounted within said chamber with second ends projecting therefrom;

a pressure pad fixedly mounted on the second ends of each of said rods; and means, pivotably mounted within the housing, for selectively contacting and moving said rods, with the pads thereon, away from said housing.

7. The apparatus as set forth in claim 6, wherein the means for selectively moving said rods comprises:

a handle having a first end extending from the housing with a second end pivotably within the housing; and first and second opposed arms, extending from said second end of the handle, located proximate the first ends of said rods, to selectively move said rods upon pivotal movement of said handle.

* * * * *